United States Patent [19]

Hayakawa et al.

[11] Patent Number: 4,592,060
[45] Date of Patent: May 27, 1986

[54] SEMICONDUCTOR LASER WITH ACTIVE LAYER HAVING REDUCED STRESS

[75] Inventors: Toshiro Hayakawa, Nara; Nobuyuki Miyauchi, Tenri; Seiki Yano, Kashihara, all of Japan

[73] Assignee: Sharp Kabushiki Kaisha, Osaka, Japan

[21] Appl. No.: 482,246

[22] Filed: Apr. 5, 1983

[30] Foreign Application Priority Data

Jul. 20, 1982 [JP] Japan ................................. 57-127302

[51] Int. Cl.⁴ .............................................. H01S 3/19
[52] U.S. Cl. ...................................... 372/44; 357/17; 372/36; 372/48
[58] Field of Search ................. 372/44, 48, 36; 357/17

[56] References Cited

PUBLICATIONS

T. Kajimura, J. Appl. Phys 51(2), Feb. 1980, pp. 908-913.

T. Hayakawa et al., Applied Physics Letters, vol. 42, No. 1, Jan. 1, 1983.
W. B. Joyce et al., "Thermal Resistance of Heterostructure Lasers", *Journal of Applied Physics*, vol. 46, No. 2, Feb. 1975, pp. 855-862.

*Primary Examiner*—James W. Davie
*Attorney, Agent, or Firm*—Birch, Stewart, Kolasch & Birch

[57] ABSTRACT

A GaAs semiconductor laser includes a GaAs semiconductor laser element, and a Cu heat sink attached to the GaAs semiconductor laser element through the use of an In solder. The GaAs semiconductor laser element includes an active layer sandwiched by cladding layers, and a substrate upon which various layers are formed. The GaAs semiconductor laser element is constructed so that the active layer is separated from the mounted surface by at least a distance which corresponds to about 32 to 35% of the entire thickness of the GaAs semiconductor laser element, thereby minimizing the stress applied to the active layer.

5 Claims, 8 Drawing Figures

SEMICONDUCTOR LASER WITH ACTIVE LAYER HAVING REDUCED STRESS

BACKGROUND AND SUMMARY OF THE INVENTION

The present invention relates to a semiconductor laser and, more particularly, to a laser device construction which ensures stable operation.

A GaAlAs semiconductor laser having the lasing wavelength in 0.8 μm range has been developed, which enjoys an operating period above $10^6$ hours at room temperature. The operating life period is greatly lengthened by minimizing occurrence of a dark line or a dark spot, or by minimizing mirror erosion. The occurrence of the dark line or the dark spot is minimized by reducing the defect density in the grown crystal, which is achieved by the improvement of the crystal growth techniques or the reduction of oxygen in the growth system. The mirror erosion is minimized if the mirror surface is coated by a dielectric film made of, for example, $Al_2O_3$, $SiO_2$ or $Si_3N_4$.

The above-mentioned semiconductor laser shows stable operation if the semiconductor laser operates as an infrared laser which has a lasing wavelength longer than 0.8 μm. However, the semiconductor laser does not show stable operation nor a long operating period if the semiconductor laser operates as a visible laser which has a lasing wavelength shorter than 0.8 μm.

To enhance the reliability of the GaAlAs semiconductor visible laser, improvements have been proposed, for example, Japanese Patent Applications Nos. 55-166124 and 56-44775, assigned to the assignee of the present application, wherein the Te-doped or Se-doped cladding layer is formed through the use of the epitaxial method, after the active layer has been formed, whereby the crystal construction of the active layer is greatly enhanced. The thus formed GaAlAs semiconductor laser exhibits the long operating period at the lasing wavelength around 0.77 μm. However, the operating period becomes suddenly short as the lasing wavelength becomes shorter than 0.77 μm.

Generally, in the GaAlAs double-heterostructure laser, the lattice constant of the GaAs substrate is similar to the lattice constant of the respective grown layers at the growth temperature, about 800° C. However, the lattice constant of the respective layers and the lattice constant of the GaAs substrate differ from each other at room temperature, because the coefficient of thermal expansion of $Ga_{1-x}Al_xAs$ varies as the AlAs mole fraction varies. The above-mentioned difference of the lattice constant creates a large stress applied to the active layer at room temperature. The thus created stress may shorten the operating life period of the semiconductor laser.

Accordingly, an object of the present invention is to provide a semiconductor laser which stably emits the laser beam in the visible spectral range.

Another object of the present invention is to provide a semiconductor laser device structure, wherein the stress applied to the active layer is minimized.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, the active layer is spaced from the mounted surface at a distance longer than a preselected value, thereby minimizing the stress applied to the active layer. More specifically, the present inventors have discovered that the stress applied to the active layer is reduced to ½ of the stress applied to the mounted surface if the active layer is formed at a position separated from the mounted surface by a distance which is about 32 to 35% of the device thickness. Moreover, the stress applied to the active layer is reduced to ½ of the stress applied to the surface opposite to the mounted surface, if the active layer is formed at a position separated from the surface opposite to the mounted surface by a distance which is about 16 to 18% of the device thickness.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

Figure 1:
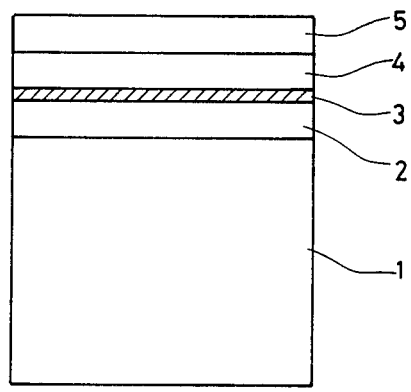
FIG. 1 is a schematic sectional view showing a basic construction of a double-heterostructure semiconductor laser element.
Figure 2:
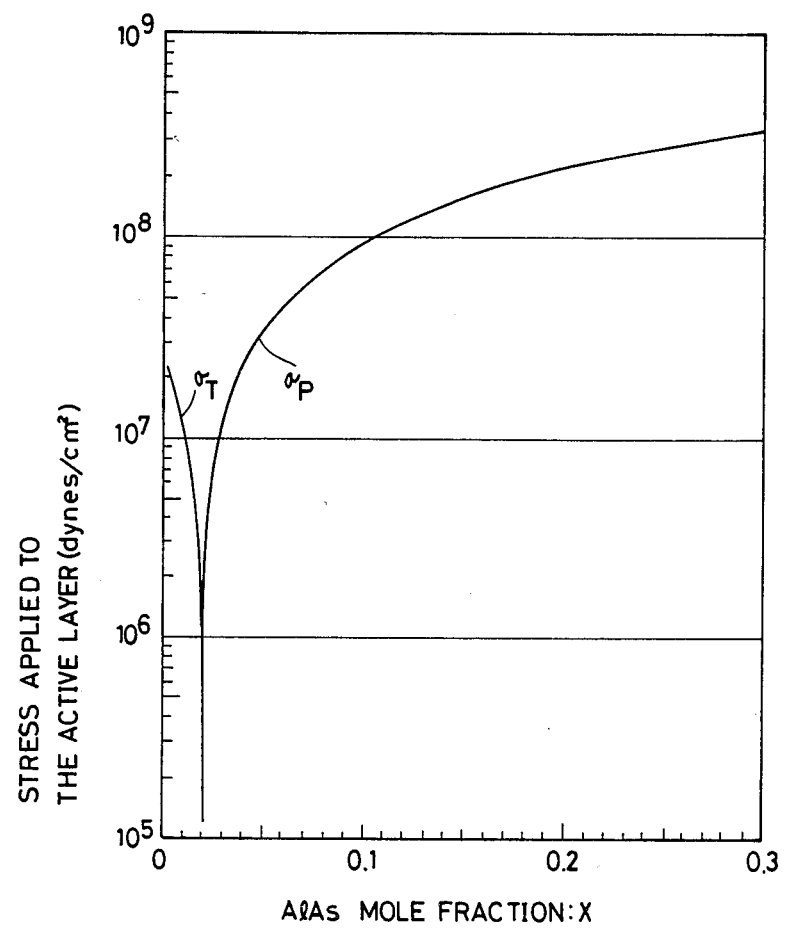
FIG. 2 is a graph showing the variation of the stress applied to an active layer of the semiconductor laser of FIG. 1 when the AlAs mole fraction of the active layer changes.

FIG. 1 schematically shows a general construction of a double-heterostructure semiconductor laser, which includes a GaAs substrate 1, a $Ga_{1-y}Al_yAs$ cladding layer 2, $Ga_{1-x}Al_xAs$ active layer 3, a $Ga_{1-y}Al_yAs$ cladding layer 4, and a GaAs cap layer 5. That is, the semiconductor laser has generally the multilayered crystal construction. If the GaAs substrate 1 has 100 μm thickness, the active layer 3 has 0.1 μm thickness, and the cladding layers 2 and 4 and the cap layer 5 have 1 μm thickness, respectively, the stress applied to the active layer 3, when a temperature is reduced from 800° C. to 20° C., can be calculated as follows. FIG. 2 shows the stress applied to the active layer 3, which is obtained from the calculation, when the AlAs mole fraction "x"

is varied while the AlAs mole fraction difference Δx (=y−x) between the active layer 3 and the cladding layers 2 and 4 is selected at 0.3.

Between x=0 and x=0.02, the tensile stress $\sigma_T$ is applied to the active layer, and the tensile stress $\sigma_T$ reduces as the AlAs mole fraction "x" increases. Above x=0.02, the compressive stress $\sigma_P$ is applied to the active layer 3, and the compressive stress $\sigma_P$ increases as the AlAs mole fraction "x" increases. The semiconductor laser of FIG. 1 exhibits the lasing wavelength 0.74 μm when the AlAs mole fraction "x"=0.2, at which the compressive stress over $2 \times 10^8$ dynes/cm² is applied to the active layer 3. The thus applied stress will deteriorate the GaAlAs visible semiconductor laser as reported in IEEE, Journal of Quantum Electronics, Vol. QE-17, No. 5, pp. 763 (1981).

Figure 3:
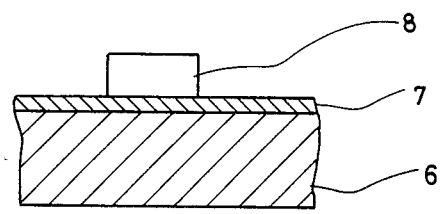
FIG. 3 is a schematic sectional view showing a condition when a semiconductor laser element is mounted on a stem.

The above-mentioned calculation is not applicable to the actual device, because the semiconductor laser is normally mounted on a Cu heat sink with In solder as shown in FIG. 3.

That is, a laser element 8 is mounted on a heat sink 6 through the use of a solder 7. The coefficients of thermal expansion of the laser element 8, the heat sink 6 and the solder 7 are different from each other and, therefore, a large stress is applied to the laser element 8 when the device is cooled from the mounting temperature to room temperature.

If a Cu heat sink of 1 mm thick is employed, a compressive stress of about $10^9$ dynes/cm² is applied to the laser element 8 when the temperature reduces by about 150° C., due to the difference of the Cu coefficient of thermal expansion ($1.7 \times 10^{-5}$) and the GaAs coefficient of thermal expansion ($6.9 \times 10^{-6}$). When an In solder is interposed between the laser element and the Cu heat sink, the compressive stress applied to the laser element is reduced toward $10^8$ dynes/cm² due to the plastic deformation formed in the In solder.

When the stress applied to the laser element, which is mounted on the Cu heat sink with the In solder, is measured through the use of the photo-elastic measurement technique, it is observed that the stress becomes small as the distance from the mounted surface increases. Furthermore, the stress becomes large as the distance from the surface opposite to the mounted surface becomes small. That is, the compressive stress is applied from the heat sink to the laser element at the mounted surface, and the tensile stress is applied to the surface opposite to the mounted surface due to the deformation created in the laser element. The stress caused by the mounted condition is greater than the stress caused by the laser element itself.

The present invention is to minimize the influence of the stress caused by the mounted condition, thereby ensuring the stable operation at the lasing wavelength below 0.77 μm.

Figure 4:
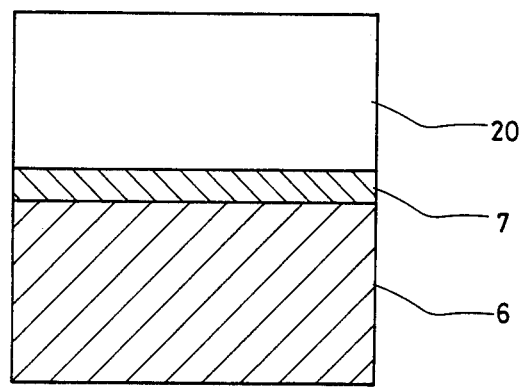
FIG. 4 is a schematic sectional view showing an example of a semiconductor laser, wherein a semiconductor laser element is mounted on a stem.

The stress caused by the mounted condition will be calculated as follows. The following calculation is conducted through the use of a semiconductor laser shown in FIG. 4.

A GaAs wafer 20 is mounted on the heat sink 6 with the solder 7. The heat sink 6 is preferably made of Cu or Si and has a thickness of 400 μm to 1 mm. The solder 7 is preferably made of In, Au-Sn, or Au-Si, and has a thickness of 1 μm to 10 μm. Now assume that the heat sink has a thickness greater than 400 μm and the laser element has a thickness greater than 150 μm. When the solder 7 endures the elastic deformation from the melting point to room temperature, the stress of 2 through $3 \times 10^8$ dynes/cm² is applied to the GaAs wafer 20 in case the Si heat sink and the In solder are employed, and the stress over $10^9$ dynes/cm² is applied to the GaAs wafer 20 in case the Cu heat sink and the solder including Au are employed.

It is preferable to employ the In solder because the In solder functions to reduce the stress applied to the laser element when the In solder endures plastic deformation in addition to the elastic deformation. Furthermore, the melting point of In is relatively low, 155° C., as compared with other solder materials and, therefore, the stress caused by the thermal expansion is reduced.

Figure 5:
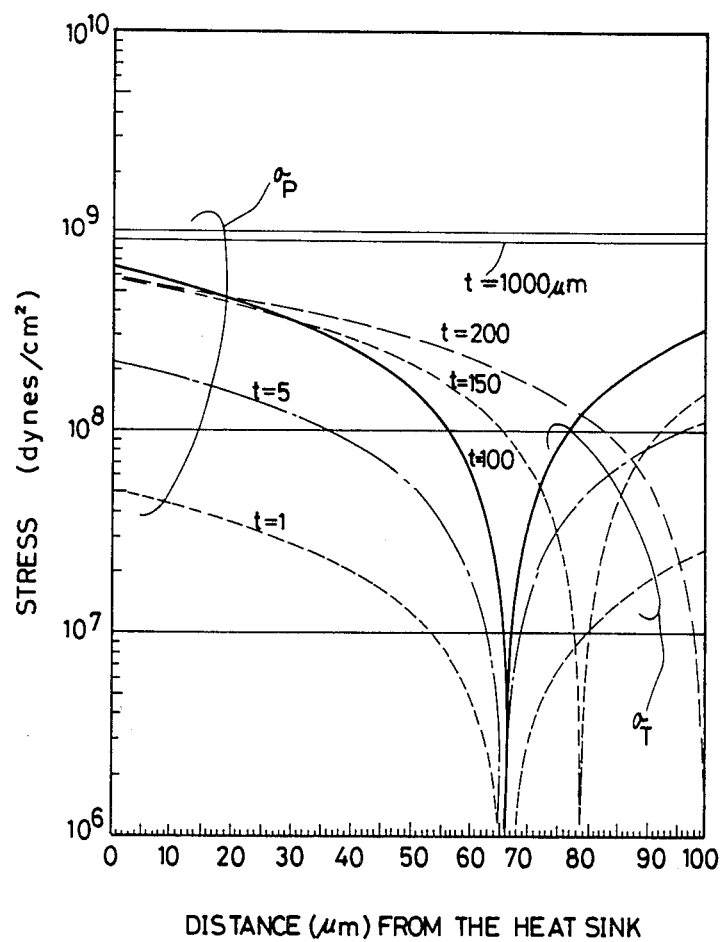
FIG. 5 is a graph showing the stress distribution in the semiconductor laser of FIG. 4 when a Cu heat sink is employed.

The effective thickness of the heat sink is reduced by the plastic deformation created in the In solder. FIG. 5 shows the stress distribution in the GaAs crystal 20 having the thickness of 100 μm when the GaAs crystal is directly mounted on the Cu heat sink having a thickness t (μm), and the temperature variation from the mounting operation to room temperature is 130° C.

When the Cu heat sink thickness "t" becomes small, the stress applied to the GaAs crystal 20 becomes small and the stress distribution in the GaAs crystal 20 shows a predetermined relationship. That is, the compressive stress is applied to the GaAs crystal 20 near the mounted surface and the tensile stress is applied to the GaAs crystal 20 near the opposing surface because Cu has a greater coefficient of thermal expansion than GaAs. The stress applied to the GaAs crystal 20 becomes zero at a position which is separated from the mounted surface by 65 μm. Even when the thickness of the GaAs crystal 20 changes, the stress becomes zero at a position which is separated from the mounted surface by a distance which corresponds to 65% of the thickness of the GaAs crystal 20.

Figure 6:
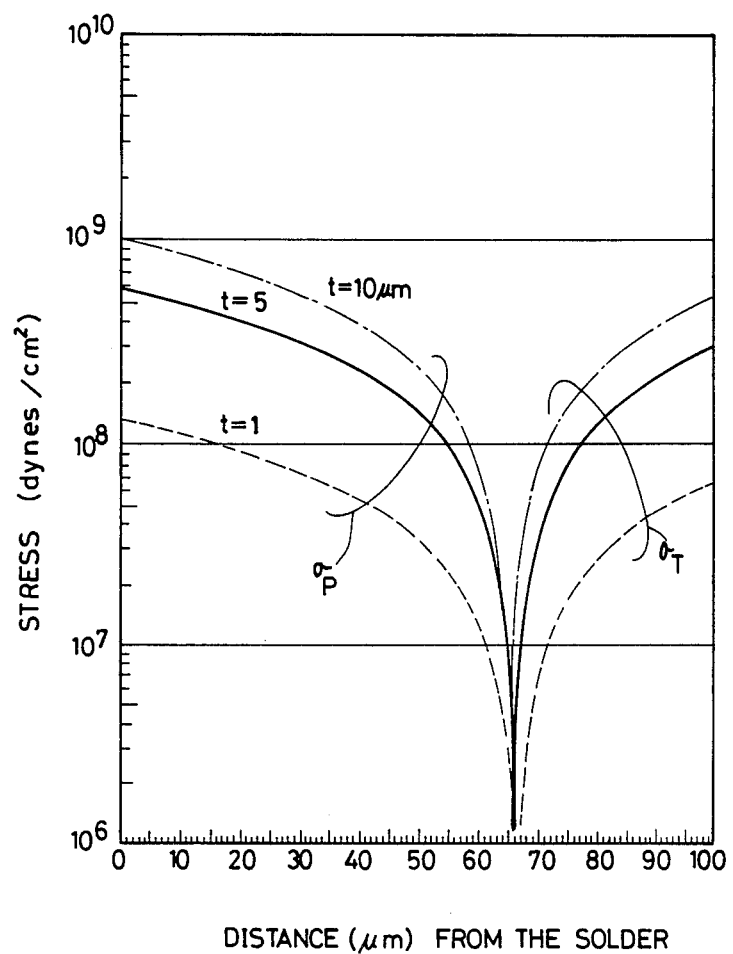
FIG. 6 is a graph showing the stress distribution in the semiconductor laser of FIG. 4 when an In solder is employed.

When the solder has a sufficient thickness, the stress applied from the heat sink is negligible because of the plastic deformation created in the solder. However, the stress caused by the solder must be taken into consideration. FIG. 6 shows a stress distribution in the GaAs crystal 20 having a thickness of 100 μm when the GaAs crystal 20 is attached to the In solder having a thickness t (μm), and the temperature variation from the mounting operation to room temperature is 130° C. The stress distribution in the GaAs crystal 20 is similar to the distribution shown in FIG. 5.

When the Si heat sink is employed, the tensile stress is applied to the GaAs crystal 20 near the mounted surface and the compressive stress is applied to the GaAs crystal 20 near the opposing surface, because the coefficient of thermal expansion of Si is smaller than that of GaAs. However, the stress distribution is similar to that shown in FIGS. 5 and 6.

Accordingly, if the active layer of the laser element is formed near a position which is separated from the mounted surface by a distance which corresponds to 65% of the element thickness, the stress applied to the active layer can be minimized. In this way, the deterioration of the laser element is minimized.

The present inventors have discovered that a stable operation is ensured when the stress applied to the active layer is reduced to ½ of the stress applied to the element surface. That is, the active layer must be formed at a position which is separated from the mounted surface by at least a distance which corresponds to 32 through 35% of the laser element thickness. Moreover, the active layer must be formed at a position which is separated from the opposing surface by at least a distance which corresponds to 16 through 18% of the laser element thickness.

Figure 7:
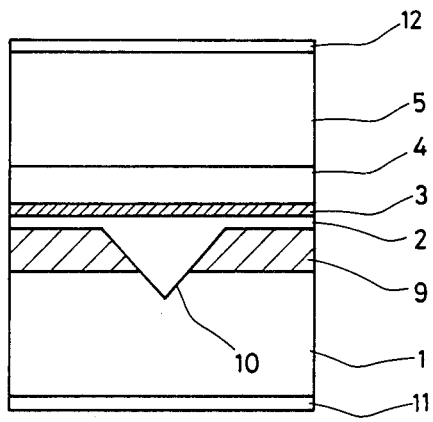
FIG. 7 is a sectional view of an embodiment of a semiconductor laser element of the present invention.

FIG. 7 shows an embodiment of a semiconductor laser of the present invention.

An n-GaAs current blocking layer 9 is first formed on a p-GaAs substrate 1. A V-shaped groove 10 is formed in the current blocking layer 9 through the use of the etching method. The V-shaped groove 10 reaches the GaAs substrate 1 to define a current path so that a semiconductor laser having a V-shaped groove for current confinement is formed. On the thus formed current blocking layer 9, a p-$Ga_{0.44}Al_{0.56}As$ cladding layer 2, a $Ga_{0.8}Al_{0.2}As$ active layer 3, an n-$Ga_{0.44}Al_{0.56}As$ claddig layer 4 and an n-GaAs cap layer 5 are formed through the use of the sequential epitaxial growth method. The GaAs substrate 1 is formed to a desired thickness through the use of an etching method, and a p-electrode 11 is formed on the rear surface. An n-electrode 12 is formed on the cap layer 5 through the use of an evaporation method. The thus formed semiconductor laser exhibits the lasing wavelength of 0.74 μm.

In the conventional semiconductor laser, the substrate 1 has a thickness of about 100 μm, the n-cladding layer 4 has a thickness of about 1 μm, and the n-cap layer 5 has a thickness of about 0.5 through 3 μm. Accordingly, the active layer 3 of the conventional semiconductor laser is formed at a position which is separated from the surface of the n-electrode 12 by a distance less than 5% of the entire thickness of the laser element. That is, the active layer 3 is exposed to a great stress in the conventional semiconductor laser.

In accordance with the present invention, the n-cap layer 5 has a thickness of 40 μm, and the GaAs substrate 1 is etched to a thickness of 70 μm. Furthermore, the n-cladding layer 4 has a thickness of 1 μm, the active layer 3 has a thickness of 0.1 μm, the p-cladding layer 2 has a thickness of 0.15 μm at a section except for the V-shaped groove 10, and the n-GaAs current blocking layer 9 has a thickness of 1 μm at a section except for the V-shaped groove 10. That is, the active layer 3 is separated from the surface of the n-electrode 12 by a distance which corresponds to 37% of the entire thickness of the laser element. The thus formed laser element is mounted on the Cu heat sink with the In solder in a manner that the n-electrode 12 contacts the In solder.

Figure 8:
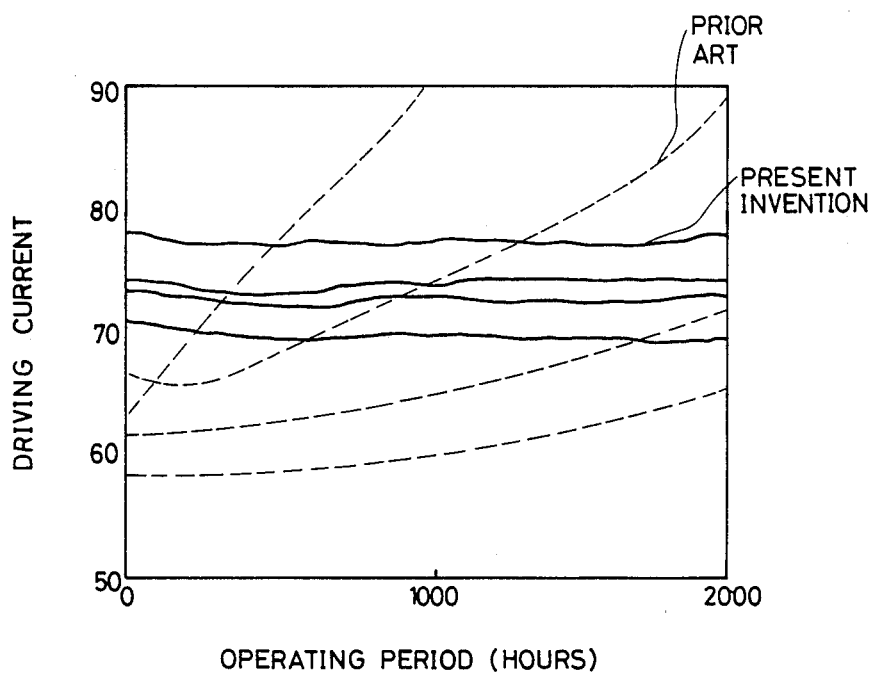
FIG. 8 is a graph showing the variation of a driving current of the semiconductor laser of FIG. 7 and the semiconductor laser of the prior art.

An operating test was conducted under a temperature of 50° C. and an output power of 5 mW. FIG. 8 shows a test result wherein a semiconductor laser of the present invention was compared with the conventional semiconductor laser having a GaAs substrate of 100 μm thick and an n-cap layer of 3 μm thick. It will be clear from FIG. 8 that the driving current was maintained substantially constant in the semiconductor laser of the present invention as shown by the solid lines. The driving current substantially changed in the semiconductor laser of the prior art as shown by the broken lines. Since the semiconductor laser of the present invention has a thicker cap layer as compared with the semiconductor laser of the prior art, the driving current is higher than the prior art device because the heat radiation is not well conducted as compared with the semiconductor laser of the prior art. However, the operating condition is stable in the semiconductor laser of the present invention.

The present invention is applicable to the GaAlAs semiconductor laser. Furthermore, the present invention is more effective for the GaAlAs semiconductor laser having the lasing wavelength in the visible range. Moreover, the present invention is applicable to other semiconductor laser such as the InGaAs semiconductor laser.

The invention being thus described, it will be obvious that the same may be varied in many ways. Such variations are not to be regarded as a departure from the spirit and scope of the invention, and all such modifications are intended to be included within the scope of the following claims.

What is claimed is:

1. In a semiconductor laser comprising:
 a semiconductor laser element including:
  a semiconductor substrate;
  an active layer formed on said semiconductor substrate; and
 a heat sink secured to one surface of said semiconductor laser element, wherein:
  said active layer is formed in said semiconductor laser element at a position which is separated from said one surface by at least a distance which corresponds to about 32 to 35% of a thickness of said semiconductor laser element and is further separated from the surface opposite to said one surface by at least a distance which corresponds to about 16 to 18% of said thickness of the semiconductor laser element.

2. The semiconductor laser of claim 1, wherein said active layer is formed in said semiconductor laser element at a position which is separated from said one surface by a distance which corresponds to 65% of said thickness of the semiconductor laser element.

3. In a semiconductor laser comprising:
 a semiconductor laser element including:
  a semiconductor substrate;
  a first cladding layer formed on said semiconductor substrate;
  an active layer formed on said first cladding layer;
  a second cladding layer formed on said active layer; and
  a cap layer formed on said second cladding layer; and
 a heat sink secured to one surface of said semiconductor laser element with a solder, wherein:
  said active layer is formed in said semiconductor laser element at a position which is separated from said one surface by at least a distance which corresponds to about 32 to 35% of a thickness of said semiconductor laser element and is further separated from the surface opposite to said one surface by at least a distance which corresponds to about 16 to 18% of the thickness of the semiconductor laser element.

4. The semiconductor laser of claim 3, wherein:
 said semiconductor substrate comprises a p-GaAs substrate; said first cladding layer comprises a p-GaAlAs cladding layer;
 said active layer comprises a GaAlAs active layer; said second cladding layer comprises an n-GaAlAs cladding layer; and
 said cap layer comprises an n-GaAs cap layer.

5. The semiconductor laser of claim 4, wherein: said heat sink comprises a Cu heat sink; and said solder comprises an In solder.

* * * * *